(12) United States Patent
Hareland et al.

(10) Patent No.: US 6,864,145 B2
(45) Date of Patent: Mar. 8, 2005

(54) METHOD OF FABRICATING A ROBUST GATE DIELECTRIC USING A REPLACEMENT GATE FLOW

(75) Inventors: Scott A. Hareland, Tigard, OR (US); Mark L. Doczy, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/611,109

(22) Filed: Jun. 30, 2003

(65) Prior Publication Data

US 2004/0266120 A1 Dec. 30, 2004

(51) Int. Cl.⁷ .......................................... H01L 21/336
(52) U.S. Cl. ..................................... 438/302; 438/576
(58) Field of Search ............................ 438/287, 294, 438/299, 301, 302, 303, 576

(56) References Cited

U.S. PATENT DOCUMENTS

| 6,316,318 B1 | * | 11/2001 | Kapoor | 438/299 |
| 6,562,687 B1 | * | 5/2003 | Deleonibus et al. | 438/303 |
| 6,716,322 B1 | * | 4/2004 | Hedge et al. | 204/192.11 |

* cited by examiner

Primary Examiner—Phuc T. Dang
(74) Attorney, Agent, or Firm—Blakely, Sokoloff, Taylor & Zafman LLP

(57) ABSTRACT

A method is described for selectively treating the properties of a gate dielectric near corners of the gate without altering the gate dielectric in a center region of a gate channel. The method includes providing a structure having a gate opening and depositing a layer of dielectric with a high dielectric constant on a bottom surface and side walls of the gate opening. The corner regions of the high dielectric constant layer formed adjacent to the bottom surface and the side walls of the gate opening are selectively treated without altering the center region of the high dielectric constant layer formed at the bottom surface of the gate opening.

18 Claims, 3 Drawing Sheets

METHOD OF FABRICATING A ROBUST GATE DIELECTRIC USING A REPLACEMENT GATE FLOW

BACKGROUND

1. Field

Embodiments relate generally to fabrication of semiconductor devices, and more particularly to a method of fabricating a gate dielectric using a replacement gate flow process.

2. Background

Replacement gate processes may be used for fabricating transistors with a wide selection of gate materials. In a replacement gate flow process, an entire transistor may be fabricated with a sacrificial gate electrode and a sacrificial gate dielectric. After all of the high temperature fabrication processes have taken place, the sacrificial gate electrode and the sacrificial gate dielectric are removed to form a gate opening and a desired gate material is deposited in the gate opening.

One problem associated with the conventional replacement gate flow process is that the corner regions of the gate trenches can have non-ideal gate dielectric due to deposition conditions or conformity issues. In conventional subtractive gate processing, a reoxidation process is typically performed on the gate stack in order to grow a small amount of oxide layer at the edges of the gate dielectric layer near the corners to improve the reliability and leakage of the device. However, in replacement gate processes, the conventional reoxidation processes cannot be utilized because the gate side walls are already sealed off before the reoxidation process can be performed.

BRIEF DESCRIPTION OF THE DRAWINGS

Embodiments may best be understood by referring to the following description and accompanying drawings, in which.

DETAILED DESCRIPTION

In one embodiment, a method is described for performing a reoxidation process in a replacement gate flow to improve the quality and manufacturability of gate dielectric. Specifically, a method is described for enabling the properties of a gate dielectric near corners of the gate to be selectively altered without chemically altering the gate dielectric in a center region of a gate channel.

In the following description, for purposes of explanation, specific details are set forth to provide a thorough understanding of embodiments of the present invention. However, it is understood that embodiments may be practiced without these specific details. In other instances, well-known structures and techniques have not been shown in detail to avoid obscuring the understanding of this description.

An example of a replacement gate flow process is illustrated in reference to FIGS. 1–4. Generally, in a replacement gate flow process, an entire transistor is typically fabricated with a sacrificial gate electrode and a sacrificial gate dielectric. After all of the high temperature fabrication processes have taken place, the sacrificial gate electrode and the sacrificial gate dielectric are removed to form a gate opening and a desired gate material is deposited in the gate opening.

Figure 1:
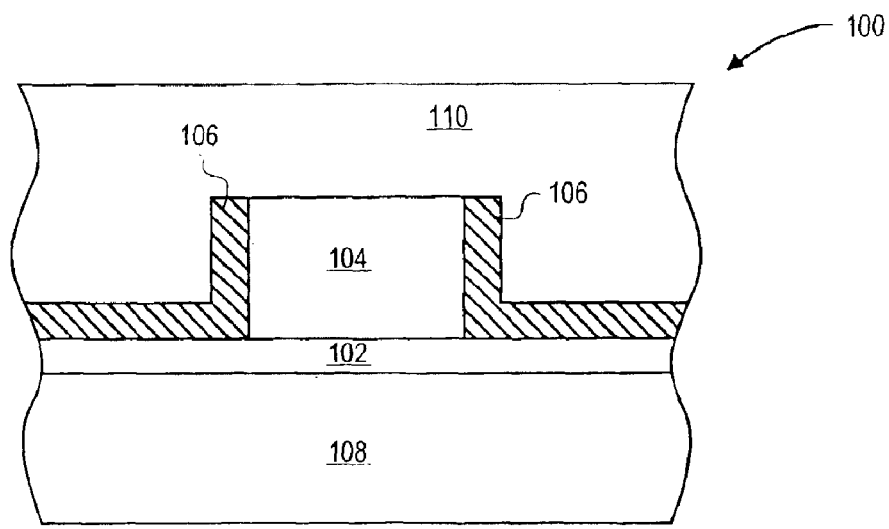
FIG. 1 shows a cross-sectional view of a portion of a structure and illustrates a starting point for replacement gate flow process.

Referring to FIG. 1, a replacement gate flow process starts with a transistor structure 100, such as a P-channel MOSFET and/or an N-channel MOSFET, that is fabricated with a sacrificial gate dielectric, 102 and a sacrificial gate electrode 104. The transistor structure includes spacers 106 surrounding the sacrificial gate electrode 104 and a substrate 108. In one embodiment, the sacrificial gate electrode 104 is composed of polysilicon and the sacrificial gate dielectric 102 is composed of silicon dioxide. In one embodiment, the spacers 106 is composed of silicon oxynitride type layer (e.g., a first thin layer of oxide and a second thin layer of silicon nitride and optional layers on top of the silicon nitride layer). After the transistor has been fabricated, a layer of insulating material 110 (e.g., interlayer dielectric "ILD" layer) is formed over the sacrificial gate electrode 104 and other portions of the transistor structure. The layer of insulating material 110 is deposited so as to surround the spacers 106 and the sacrificial gate electrode 104. It should also be noted that well-known structures of a transistor, such as a drain and a source, are not shown in the drawings in order to avoid obscuring the understanding of this description.

Figure 2:
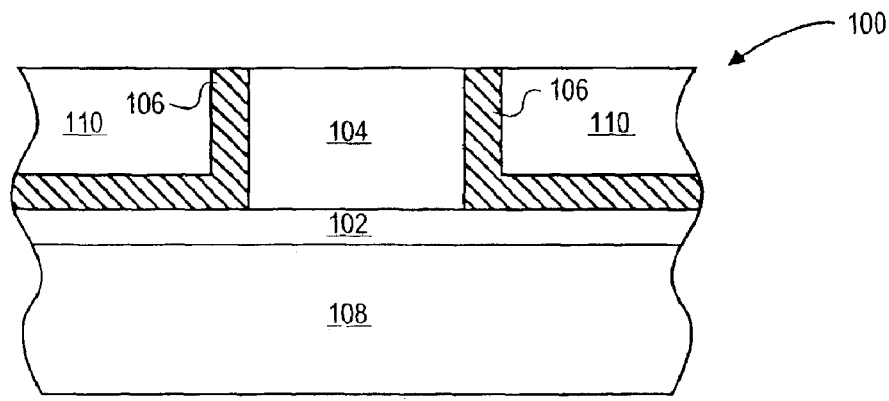
FIG. 2 shows the structure of FIG. 1 after a layer of insulating material is polished down to expose a sacrificial gate electrode.

FIG. 2 illustrates the structure 100 of FIG. 1 after the layer of insulating material 110 is polished down to expose the sacrificial gate electrode 104. The insulating material layer 110 may be polished down using a chemical mechanical polishing process.

Figure 3:
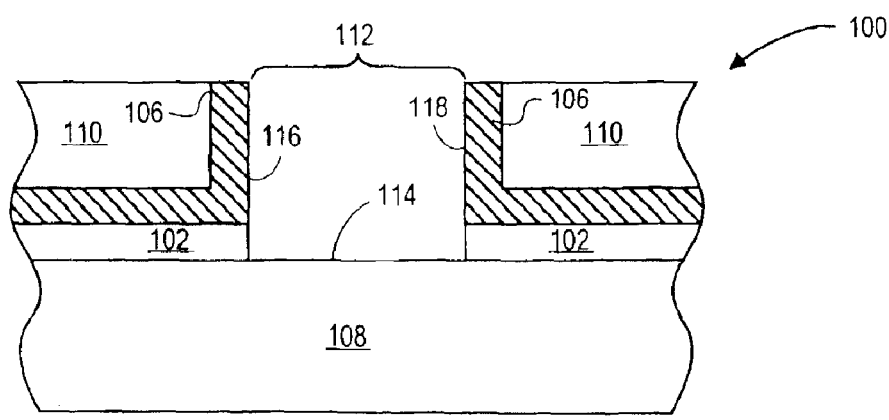
FIG. 3 shows the structure of FIG. 2 after the sacrificial gate electrode and sacrificial gate dielectric layer are etched away to form a gate opening.

Referring to FIG. 3, the structure 100 of FIG. 2 is shown after the sacrificial gate electrode 104 and the sacrificial gate dielectric layer 102 underneath the sacrificial gate electrode are removed to form a gate opening 112. The gate opening is defined by a bottom surface 114 and side walls 116 and 118. The sacrificial gate electrode 104 and the sacrificial gate dielectric layer 102 may be removed using a selective etching process.

Figure 4:
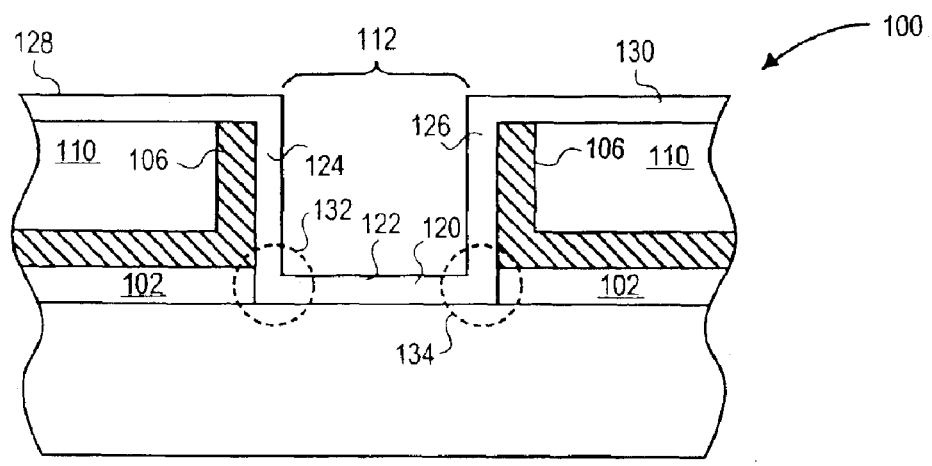
FIG. 4 shows the structure of FIG. 3 after a layer of dielectric with a high dielectric constant (high-k film) is deposited on the side walls and the bottom surface of the gate opening.

FIG. 4 illustrates the structure 100 of FIG. 3 after a layer of dielectric 120 with a high dielectric constant (also referred herein as "high-k dielectric film") is deposited on the side walls 116, 118 and the bottom surface 114 of the gate opening 112. In one embodiment, the high-k dielectric film 120 is a dielectric layer with a dielectric constant greater than silicon dioxide. In CMOS (complementary metal-oxide-silicon) devices, high-k dielectric film serves as a thin insulating layer between the gate and the channel of the device. The high dielectric constant film 120 may be composed of a variety of materials, including hafnium-dioxide, zirconium-dioxide, lanthanum-oxides, titanium-oxides, silicate or other high dielectric constant material known in the art. Silicon dioxide or silicon nitride may also be utilized. FIGS. 1–4 represent one example of a replacement gate flow. Other suitable techniques and materials may be employed for constructing replacement gate flow.

Referring to FIG. 4, the lower corner regions 132, 134 of the high-k dielectric film 120 can have non-ideal gate dielectric characteristics due to deposition conditions or conformality issues. In accordance with one embodiment, a reoxidation process is performed in a replacement gate flow to improve the quality of gate dielectrics 120 (e.g., overall stack reliability) while not adversely altering the electrical properties of the gate dielectric that determine the device performance. This is accomplished by selectively altering the properties of the gate dielectric in the lower corner regions 132, 134 of the gate without altering the gate dielectric in the center region 122 thereof.

Figure 5:
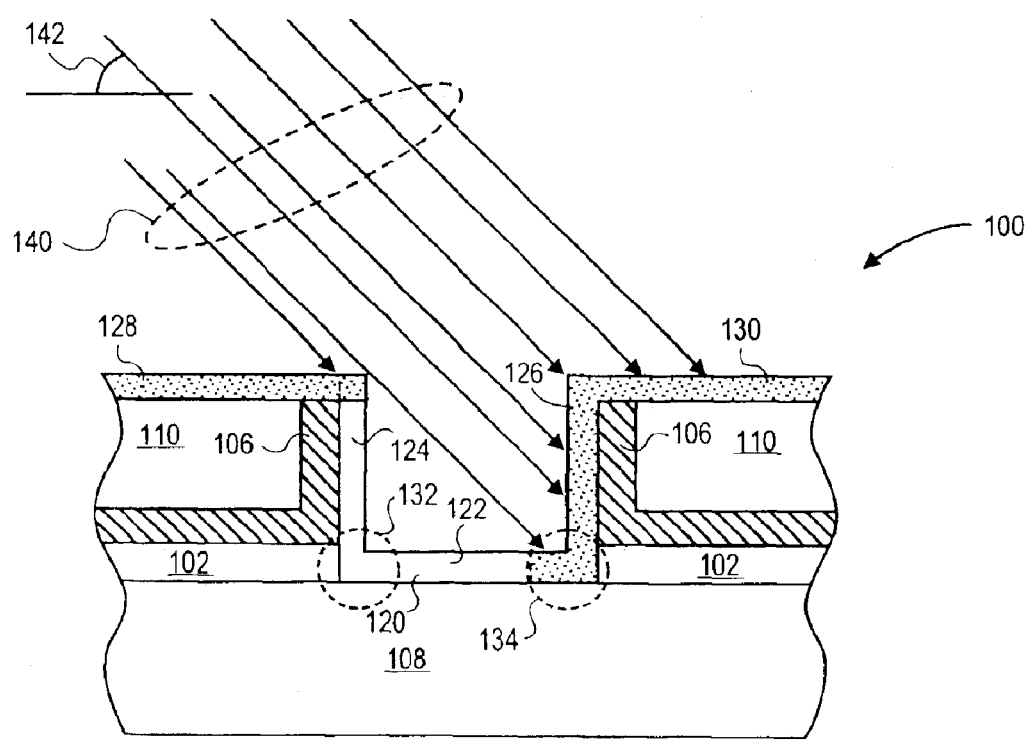
FIG. 5 shows the structure of FIG. 4 being treated with directional ion implantation or plasma treatment from a first angle to alter the properties of the lower right corner region of the high-k film.
Figure 6:
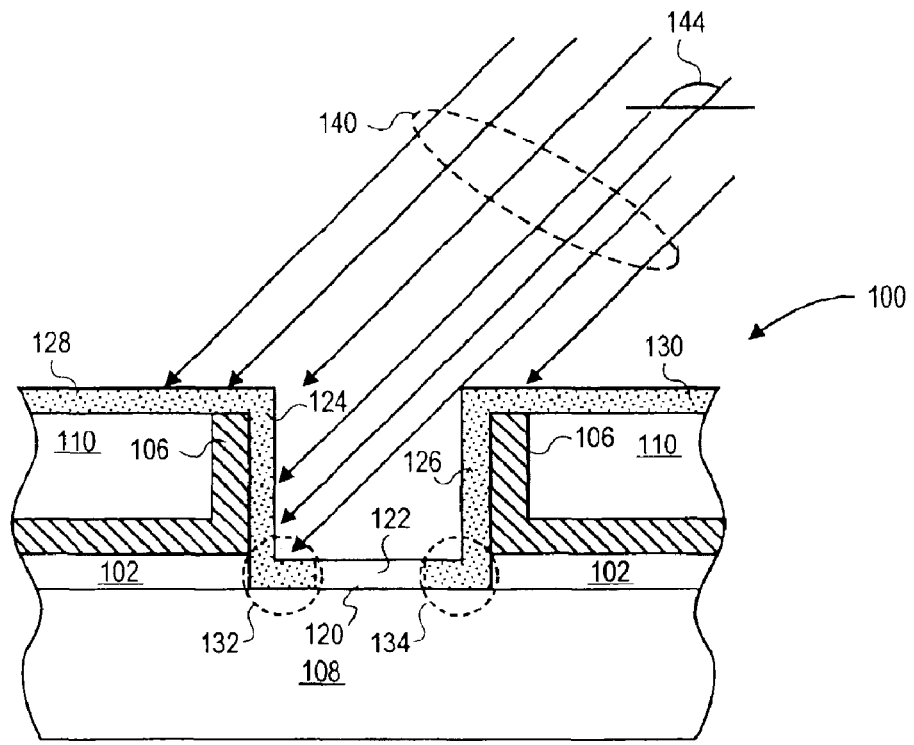
FIG. 6 shows the structure of FIG. 5 being treated with directional ion implantation or plasma treatment from a second angle to alter the properties of the lower left corner region of the high-k film.

In accordance with one embodiment, a treatment is performed to either alter the chemical characteristic or the thickness of the high-k dielectric film 120 in the corner regions 132, 134 of the gate opening 112. FIG. 5 illustrates the structure 100 of FIG. 4 being treated to selectively alter the properties of the lower right corner regions 134 of the high dielectric constant layer 120. In one embodiment, angled ion implantation 140 is applied from a first angle 142 to treat the lower right corner 134 of the high dielectric constant layer. Once the angled ion implantation from the first angle is completed, the structure 100 is rotated (e.g., 180°) and the angled ion implantation 140 is applied from a second angle 144 to treat the lower left corner region 132 of the high dielectric constant layer 120, as shown in FIG. 6. In one implementation, the angled ion implantation process comprises implanting ultra-low energy oxidizing or nitrodizing species to treat the lower corner regions 132, 134 of the high-k dielectric film 120. Other types of ions may also be used with the ion implantation process, including chlorine, fluorine, hafnium and other materials that would either densify or alter the chemical structure (e.g., to improve the chemical bonding) of the high dielectric constant layer to make the corner regions more robust.

The angled ion implantation 140 may be accomplished with an ion implantor. The ion implantor may include an ion beam generator to generate an ion beam. The direction of the ion beam with respect to the structure can be adjusted either by maintaining the wafer including the structure at a certain angle or by adjusting the angle of the ion beam. The implant species, energy level of the ion beam and/or the duration of the ion beam exposure may be adjusted to achieve optimal oxide layer growth or alteration.

In another embodiment, directional plasma treatment 140 is applied from a first angle 142 to alter the properties (e.g., oxidize or nitrodize) of the lower right corner region 134 of the high dielectric constant layer 120, as shown in FIG. 5. Once the directional plasma treatment from the first angle is completed, the structure 100 is rotated (e.g., 180°) and the directional plasma treatment 140 is applied from a second angle 144 to treat the lower left corner region 132 of the high dielectric constant layer, as shown in FIG. 6. Directionality can be obtained from a plasma by using an accelerating screen or grid to redirect the plasma species. Deflector plates may also be used to orient the wafer so that even though the energetic particles (i.e., gas mixture energized to a plasma state) arrives at a normal incident to the wafer containing the structure, the wafer is bombarded by the energetic particles at an angle.

In accordance with one embodiment, the shadowing effects of the damascene gate trenches are used to mask the center region 122 of the gate dielectric 120 from the directional ion implantation or plasma treatment process, as illustrated in FIGS. 5 and 6. Chemically altering the center region 122 of the high-k dielectric layer 120 could degrade the characteristics of the transistor device. By confining the ion implantation or plasma treatment to the corners regions 132, 134 of the gate channel, the process according to one embodiment of the present invention enables the corner regions of the gate channel to become more robust and reliable without sacrificing the performance of the transistor device.

Prior to the dielectric treatment process, appropriate angles 142, 144 (shown in FIGS. 5 and 6) are determined for properly directing the ion implantation or plasma treatment. In accordance with one embodiment, the angles 142, 144 (shown in FIGS. 5 and 6) of the treatment processes are computed based on one or more of the following factors: the height of the damascene gate region, the nominal gate length, and the lateral extent of the corner regions to be treated.

Figure 7:
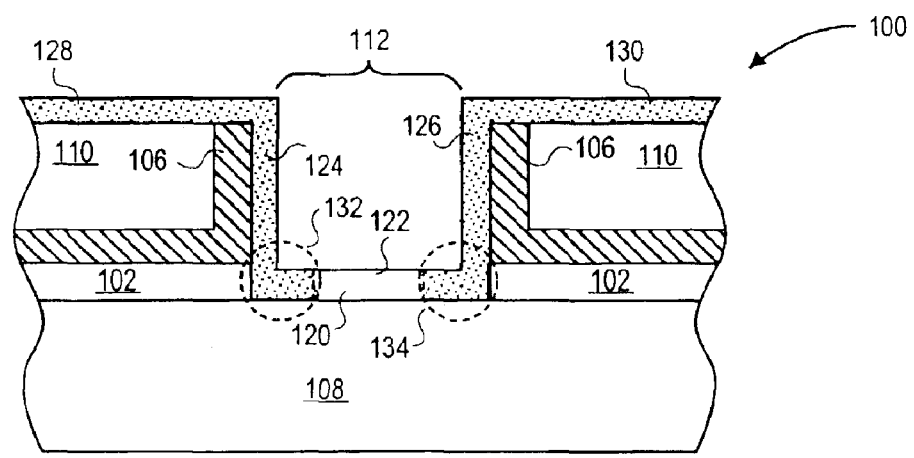
FIG. 7 shows the structure of FIG. 6 after the angled implantation process to treat the lower corner regions of the high-k film.

FIG. 7 shows the structure 100 after completion of the reoxidation process to selectively treat the lower corner regions 132, 134 of the high dielectric layer 120 formed in the gate opening 112. As shown, in one embodiment, the corners regions 132, 134, the side walls 124, 126 and the top surfaces 128, 130 of the high dielectric layer 120 are chemically altered (e.g., slight oxidized or nitrodized) while the center channel region 122 remains unaltered. It should be noted that chemically altering the high-k dielectric layer formed on the top surfaces 128, 130 of the structure 100 does not effect the characteristics of the transistor device because it will eventually be etched or polished away. It should also be noted that chemically altering the high-k dielectric layer formed on the side walls 124, 126 also does not effect the characteristics of the transistor device. Only the high-k dielectric layer formed along the bottom surface 122 and corner regions 132, 134 of the gate channel influence the characteristics of the device. Once the reoxidation process has been completed, subsequent processes may be performed, including the deposition of the gate electrode.

While the invention has been described in terms of several embodiments, those skilled in the art will recognize that the invention is not limited to the embodiments described, but can be practiced with modification and alteration within the spirit and scope of the appended claims. For example, it should be noted that the embodiments of the reoxidation process described above are not limited to the example replacement gate flow process described in reference to FIGS. 1 to 4, and that the reoxidation process described herein may be applicable to other instances where certain regions of a layer formed in an opening of a structure require selective treatment or selective alteration. The description is thus to be regarded as illustrative instead of limiting.

What is claimed is:

1. A method comprising:
   providing a structure having a gate opening, the gate opening defined by side walls and a bottom surface;
   depositing a layer of a dielectric material with a dielectric constant greater than silicon dioxide on the bottom surface and at least a portion of the side walls of the gate opening; and
   selectively treating the layer of dielectric material where deposited on at least a portion of the side walls of the gate opening.

2. The method of claim 1, wherein the selective treating comprises chemically altering the corner regions of the high dielectric constant layer.

3. The method of claim 1, wherein the selectively treating comprises:
performing ion implantation from a first angle such that one of the side walls of the gate opening serves to mask the center region and one of the corner regions of the dielectric material formed in the gate opening; and
performing ion implantation from a second angle such that the other side wall of the gate opening serves to mask the center region and the other corner regions of the dielectric material formed in the gate opening.

4. The method of claim 3, wherein the first and second angles are determined based on at least one of height of the side walls and lateral extend of the corner regions to be treated.

5. The method of claim 3, wherein the performing ion implantation comprises implanting ultra-low energy oxidizing or nitrodizing species in the dielectric material.

6. The method of claim 1, wherein the selectively treating comprises:
performing directional plasma treatment from a first angle such that one of the side walls of the gate opening serves to mask the center region and one of the corner regions of the high dielectric material formed in the gate opening; and
performing directional plasma treatment from a second angle such that the other side wall of the gate opening serves to mask the center region and the other coiner regions of the high dielectric material formed in gate opening.

7. The method of claim 6, wherein the first and second angles are determined based on at least one of height of the side walls and lateral extend of the corner regions to be treated.

8. The method of claim 6, wherein directionality of the plasma treatment is achieved by using an accelerating screen.

9. The method of claim 6, wherein directionality of the plasma treatment is achieved by using a deflection plate.

10. The method of claim 1, wherein the providing a structure having a gate opening comprises:
fabricating a transistor on a substrate, the transistor including a sacrificial gate dielectric and a sacrificial gate electrode and spacers surrounding the sacrificial gate electrode;
depositing a layer of insulating material to surround the spacers and the sacrificial gate electrode;
polishing down the layer of insulating material to expose the sacrificial gate electrode; and
removing the sacrificial gate electrode and the sacrificial gate dielectric to form the gate opening.

11. The method of claim 1, wherein the treated corner regions are lower corner regions formed between the bottom surface and the side walls of the gate opening.

12. A method comprising:
providing a structure having an opening, the opening defined by side walls and a bottom surface of a dielectric material; and
treating the dielectric material using a shadowing effect of the opening to mask a center region of the bottom surface of the opening.

13. The method of claim 12, further comprising performing directional treatment from a first angle such that one of the side walls of the opening selves to mask the center region and one of corner regions of the opening.

14. The method of claim 13, further comprising performing directional treatment from a second angle such that the other side wall of the opening serves to mask the center region and the other corner regions of the opening.

15. The method of claim 14, wherein the first and second angles are determined based on at least one of height of the side walls and lateral extent of corner regions to be treated.

16. The method of claim 14, wherein prior to treating, the method comprises defining the dielectric material by depositing a layer of dielectric material with a dielectric constant greater than silicon dioxide on the bottom surface and at least a portion of the side walls of the opening.

17. The method of claim 16, wherein the directional treatments from the first and second angles are performed to selectively treat corner regions of the dielectric material formed in the opening without altering a center region of the dielectric material formed at the bottom surface of the opening.

18. The method of claim 12, wherein the providing a structure having an opening comprises;
fabricating a transistor on a substrate, the transistor including a sacrificial gate dielectric and a sacrificial gate electrode and spacers surrounding die sacrificial gate electrode;
depositing a layer of insulating material to surround the spacers and the sacrificial gate electrode;
polishing down the layer of insulating material to expose the sacrificial gate electrode; and
removing the sacrificial gate electrode and the sacrificial gate dielectric to form the opening.

* * * * *

UNITED STATES PATENT AND TRADEMARK OFFICE
CERTIFICATE OF CORRECTION

PATENT NO. : 6,864,145 B2
DATED : March 8, 2005
INVENTOR(S) : Hareland et al.

It is certified that error appears in the above-identified patent and that said Letters Patent is hereby corrected as shown below:

Column 5,
Line 28, delete "coiner" and insert -- corner --.

Column 6,
Line 16, delete "selves" and insert -- serves --.
Line 40, delete "die" and insert -- the --.

Signed and Sealed this

Ninth Day of August, 2005

JON W. DUDAS
*Director of the United States Patent and Trademark Office*